United States Patent
Hsieh et al.

(10) Patent No.: US 9,262,820 B2
(45) Date of Patent: Feb. 16, 2016

(54) METHOD AND APPARATUS FOR INTEGRATED CIRCUIT DESIGN

(71) Applicant: UNITED MICROELECTRONICS CORPORATION, Hsinchu (TW)

(72) Inventors: Te-Hsien Hsieh, Kaohsiung (TW);
Ming-Jui Chen, Hsinchu (TW);
Cheng-Te Wang, Hsinchu County (TW);
Jing-Yi Lee, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/281,881

(22) Filed: May 19, 2014

(65) Prior Publication Data

US 2015/0332449 A1    Nov. 19, 2015

(51) Int. Cl.
*G06K 9/00*    (2006.01)
*G06T 7/00*    (2006.01)
*G06K 9/52*    (2006.01)

(52) U.S. Cl.
CPC ............ *G06T 7/0004* (2013.01); *G06K 9/52* (2013.01)

(58) Field of Classification Search
CPC .......................... G06T 7/0004; G06K 9/52
USPC ............. 382/144; 716/50, 53, 55; 703/6, 14
See application file for complete search history.

(56) References Cited

U.S. PATENT DOCUMENTS

| | | | |
|---|---|---|---|
| 5,825,647 A * | 10/1998 | Tsudaka | 430/5 |
| 6,289,499 B1 * | 9/2001 | Rieger et al. | 716/53 |
| 7,200,833 B2 * | 4/2007 | Izuha et al. | 716/52 |
| 7,398,508 B2 | 7/2008 | Shi | |
| 7,536,670 B2 | 5/2009 | Perçin | |
| 8,331,646 B2 * | 12/2012 | Agarwal et al. | 382/144 |
| 8,572,525 B2 | 10/2013 | Chew | |
| 8,584,056 B2 * | 11/2013 | Chen et al. | 716/53 |
| 8,990,755 B2 * | 3/2015 | Swanson et al. | 716/124 |
| 2002/0062206 A1 * | 5/2002 | Liebchen | 703/6 |
| 2004/0142251 A1 * | 7/2004 | Hsu et al. | 430/5 |
| 2005/0015233 A1 * | 1/2005 | Gordon | 703/13 |
| 2009/0113359 A1 | 4/2009 | Chew | |
| 2010/0023916 A1 * | 1/2010 | Chew et al. | 716/19 |
| 2011/0047520 A1 * | 2/2011 | Chew et al. | 716/52 |
| 2012/0253774 A1 | 10/2012 | Ye | |
| 2013/0000505 A1 | 1/2013 | Tao | |

* cited by examiner

*Primary Examiner* — Samir Ahmed
(74) *Attorney, Agent, or Firm* — Ding Yu Tan

(57) ABSTRACT

A method for IC design is provided. Firstly, an IC design layout having a main feature with an original margin is received. Then, a first modified margin of the main feature is generated; and a first photolithography simulation procedure of the main feature with the first modified margin is performed to generate a first contour having a plurality of curves. Next, an equation of each of the curves is obtained; each equation of the curves is manipulated to obtain a vertex of each of the curves. After that, a first group of target points are assigned to the original margin. Each of the first group of target points respectively corresponds to one of the vertices. Finally, an optical proximity correction (OPC) procedure is performed by using the first group of target points to generate a second modified margin. An apparatus for IC design is also provided.

13 Claims, 7 Drawing Sheets

METHOD AND APPARATUS FOR INTEGRATED CIRCUIT DESIGN

FIELD OF THE INVENTION

The present invention relates to a method and an apparatus for integrated circuit design, and more particularly to a method and an apparatus for optical proximity correction utilized in integrated circuit design.

BACKGROUND OF THE INVENTION

In the semiconductor integrated circuit (IC) industry, photolithography is the process to use light to transfer circuit patterns to a semiconductor wafer, such as, a silicon or GaAs wafer. However, the photolithography process becomes more challenging when the desired pattern size on wafer becomes smaller and smaller and the features of the pattern become closer and closer to each other.

Besides, duo to the limitations of light, these transferred patterns appear with errors or irregularities such as line widths that are narrower or wider than designed. If these distortions are not corrected, the electrical properties of what was being fabricated may be altered significantly. Therefore, it is desirable to find a method for IC design to compensate for image errors.

SUMMARY OF THE INVENTION

In accordance with an aspect, the present invention provides a method for integrated circuit (IC) design, which includes steps as follows. Firstly, an IC design layout having a main feature with an original margin is received. Then, a first modified margin of the main feature is generated; and a first photolithography simulation procedure of the main feature with the first modified margin is performed by using a processor to generate a first contour having a plurality of curves. Next, an equation of each of the curves for the first contour is obtained, wherein each equation is expressed as a Taylor series; each equation of the curves is manipulated by using the processor to obtain a vertex of each of the curves. After that, a first group of target points are assigned to the original margin of the main feature. Each of the target points from the first group of target points respectively corresponds to one of the vertices. Finally, an optical proximity correction (OPC) procedure is performed by using the first group of target points to generate a second modified margin.

In accordance with an aspect, the step of generating the first modified margin of the main feature includes of having the original margin of the main feature being dissected into a plurality of segments, wherein the curves for the first contour respectively correspond to the segments; and a second group of target points are assigned to the original margin of the main feature.

In accordance with an aspect, each equation expressed as the Taylor series is defined by a plurality of points of each of the curves.

In accordance with an aspect, the points of each of the curves include the vertex thereof.

In accordance with an aspect, the step of manipulating each equation of the curves includes obtaining a first derivative by performing differentiation on each equation; and a value of a variable at each vertex is obtained by setting each first derivative equal to zero.

In accordance with an aspect, a value of the variable at one of the target points from the first group of target points is equal to the value of the variable at the vertex which is corresponding to the target point.

In accordance with an aspect, the method further includes steps of a second photolithography simulation procedure of the second modified margin being performed by using the processor to generate a second contour; and an OPC evaluation procedure is performed to determine if the second contour meets the first group of target points.

In accordance with an aspect, the method further includes a step of the IC design layout having the main feature with the second modified margin being outputted if the second contour meets the first group of target points.

In accordance with an aspect, the step of performing the OPC procedure includes performing a convergence process repeatedly.

In accordance with another aspect, the present invention provides an apparatus for integrated circuit (IC) design, which includes a processor, a receiving module and a non-transitory computer-readable storage. The receiving module is communicatively coupled to the processor, and is configured to receive an IC design layout having a main feature with an original margin. The non-transitory computer-readable storage communicatively coupled to the processor includes instructions executable by the processor. The instructions include the following: instructions to generate a first modified margin of the main feature; instructions to perform a first photolithography simulation procedure of the main feature with the first modified margin to generate a first contour having a plurality of curves; instructions to obtain an equation of each of the curves, wherein each equation is expressed as a Taylor series; instructions to manipulate each equation of the curves to obtain a vertex of each of the curves; instructions to assign a first group of target points to the original margin of the main feature, wherein each of the target points from the first group of target points corresponds to one of the vertices, respectively; and instructions to perform an optical proximity correction (OPC) procedure by using the group of target points to generate a second modified margin.

In accordance with an aspect, the instructions to generate the first modified margin include instructions to dissect the original margin of the main feature into a plurality of segments; instructions to assign a second group of target points to the original margin of the main feature; and instructions to perform an another OPC procedure by using the second group of target points to generate the first modified margin.

In accordance with an aspect, various instructions to manipulate each equation of the curves for the first contour include instructions to obtain a first derivative by differentiating each equation; and instructions to set each of the first derivative equal to zero to obtain a value of a variable at each vertex.

In accordance with an aspect, the instructions further include instructions to perform a second photolithography simulation procedure of the second modified margin to generate a second contour; and instructions to perform an OPC evaluation procedure to determine if the second contour meets the first group of target points.

In accordance with an aspect, the instructions further include instructions to output the IC design layout having the main feature with the second modified margin if the second contour meets the first group of target points.

In accordance with an aspect, the instructions to perform the OPC procedure include instructions to perform a convergence process repeatedly.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
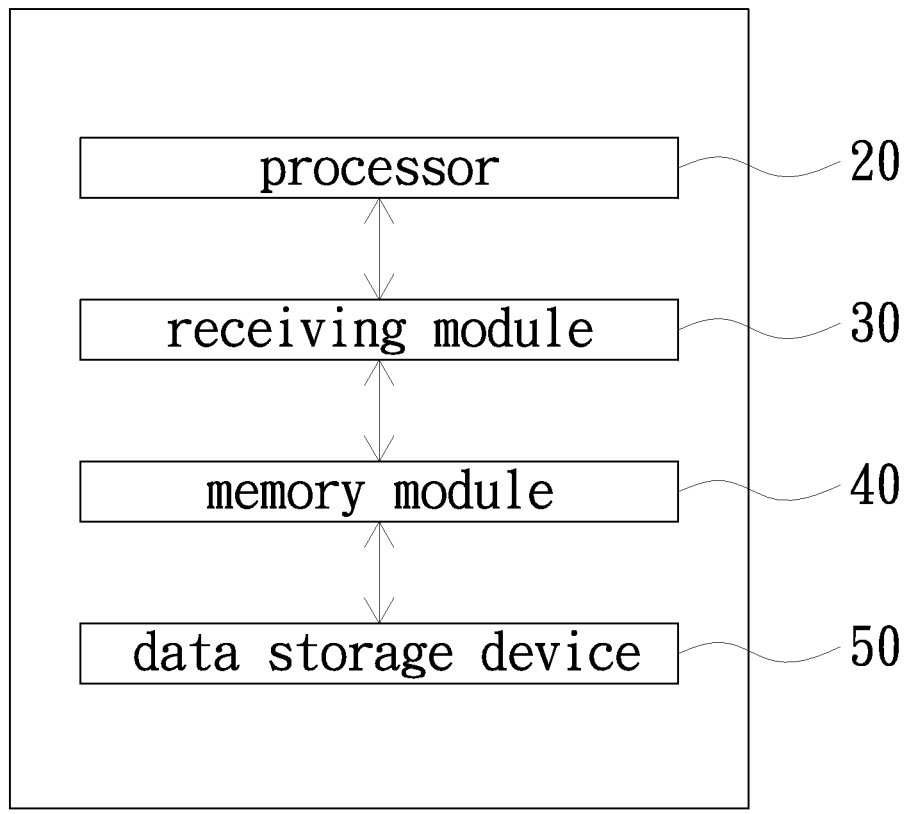
FIG. 1 is a diagram showing an apparatus for modifying IC design layout before photomask fabrication according to one embodiment of the present invention.

FIG. 1 is a diagram showing an apparatus for modifying IC design layout before photomask fabrication according to one embodiment of the present invention. Referring to FIG. 1, an apparatus 10 may be an information processing apparatus, such as a computer, server, or other suitable device. The apparatus 10 includes a processor 20, a receiving module 30, a memory module 40 and a data storage device 50. The processor 20 is communicatively coupled to the receiving module 30, the memory module 40 and the data storage device 50. The receiving module 30 is configured to receive information such as IC design layout files from IC design house. The receiving module 30 may be Ethernet cards, cellular data radios, but not limited hereto. The memory module 40 provides the processor 20 with non-transitory computer-readable storage to facilitate execution of computer instructions by the processor 20. The memory module 40 may be a random access memory (RAM) device or a solid state memory device or other memory devices known in the art. The data storage device 50 may store instructions, data, or computer programs. Examples of the data storage device 50 may include but not limit to hard discs, optical discs, solid-state storage devices.

The apparatus 10 is configured to modify IC design layout based on many design rules and limitations after it is inputted from a design house and before it is outputted for photomask fabrication. In one embodiment, the IC design layout may be expressed in a GDSII file format (or DFII file format).

Figure 2:
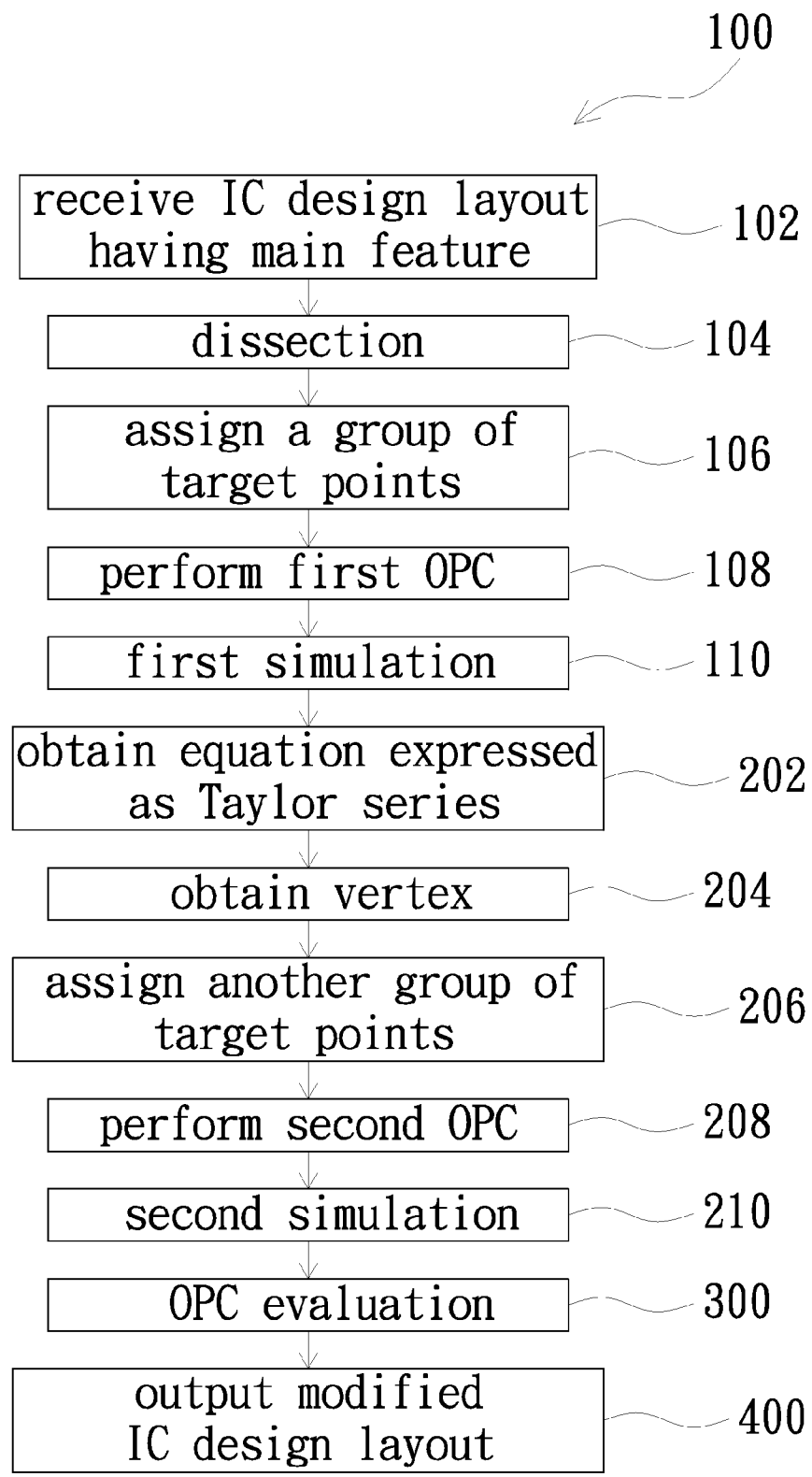
FIG. 2 is a flowchart of a method for modifying integrated circuit (IC) design layout before photomask fabrication according to one embodiment of the present invention.
Figure 3:
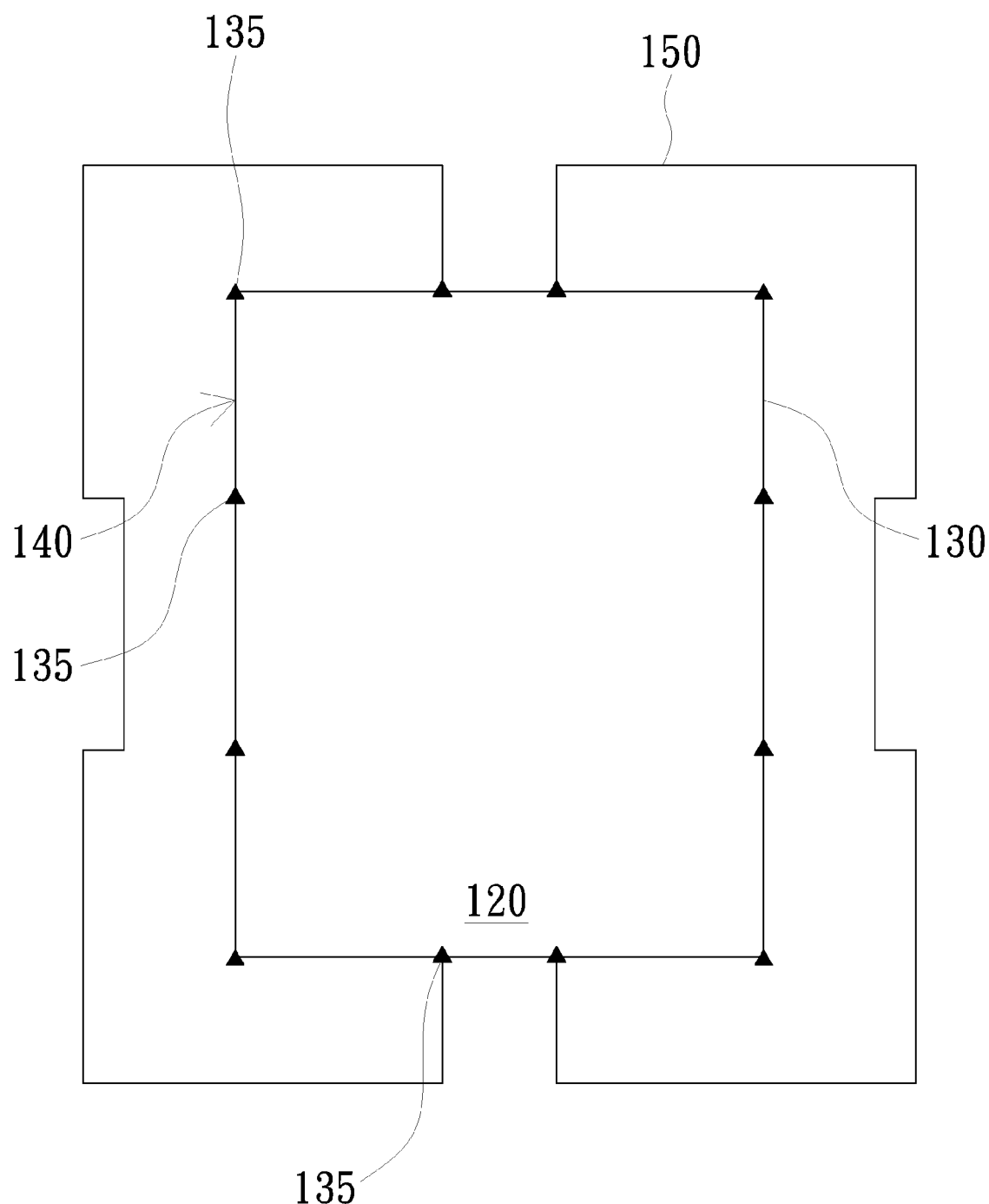
FIG. 3 illustrates an example main feature with an original margin and a first modified margin.

FIG. 2 is a flowchart of a method 100 for modifying integrated circuit (IC) design layout before photomask fabrication according to one embodiment of the present invention. The method 100 may be implemented by the apparatus 10 shown in FIG. 1 and suitable for a source mask optimization (SMO) processing. The method 100 begins in Step 102 including the receiving module 30 receives an IC design layout. The IC design layout includes various geometrical patterns representing features of an IC. For example, the IC design layout may include main features such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Referring to FIG. 3, an example main feature 120 that is a feature contained in the IC design layout is illustrated. In the illustrated embodiment, the main feature 120 includes an original margin 130 defining the shape of the main feature 120. The rectangular shape of the main feature 120, as shown in FIG. 3, is only an exemplary embodiment, and the present invention is not limited thereto.

The method 100 next proceeds to Step 104, which includes of a dissection process performed on the main feature 120. Specifically, as shown in FIG. 3, the original margin 130 is dissected into multiple segments by a plurality of dissection points 135. For example, one segment 140, as a portion of the original margin 130, is defined by two adjacent dissection points 135. Next, in Step 106, a group of target points (not shown) are assigned to the original margin 130 of the main feature 120. Then, in Step 108, a first optical proximity correction (OPC) procedure is performed on the IC design layout by using the group of target points so as to generate a first modified margin 150, as shown in FIG. 3. The OPC procedure is a lithography enhancement technique used to compensate for image errors. The OPC procedure may be implemented as model-based software instructions executing on the apparatus 10.

Figure 4:
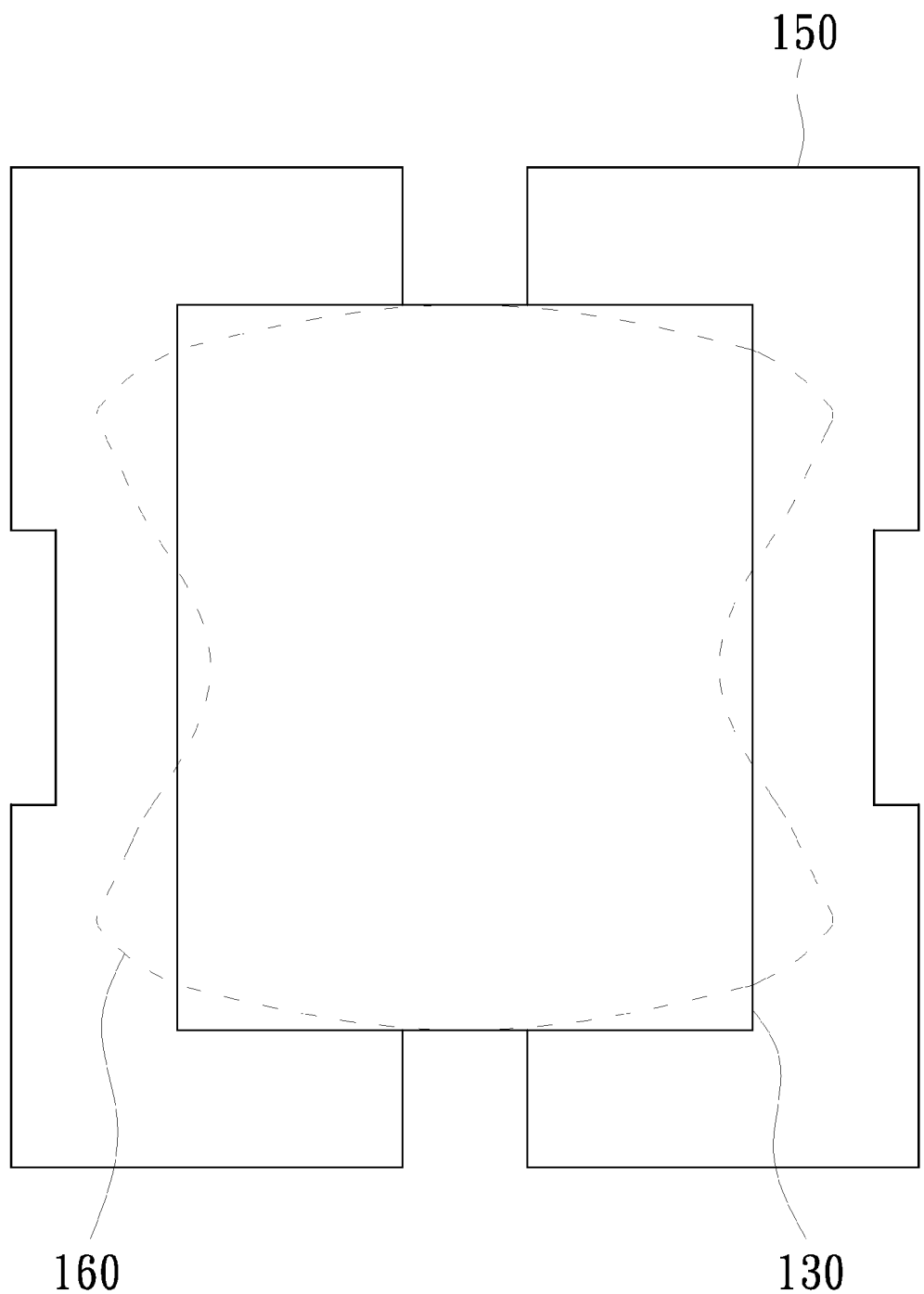
FIG. 4 illustrates an example first contour resulting from a first photolithography simulation procedure.
Figure 5:
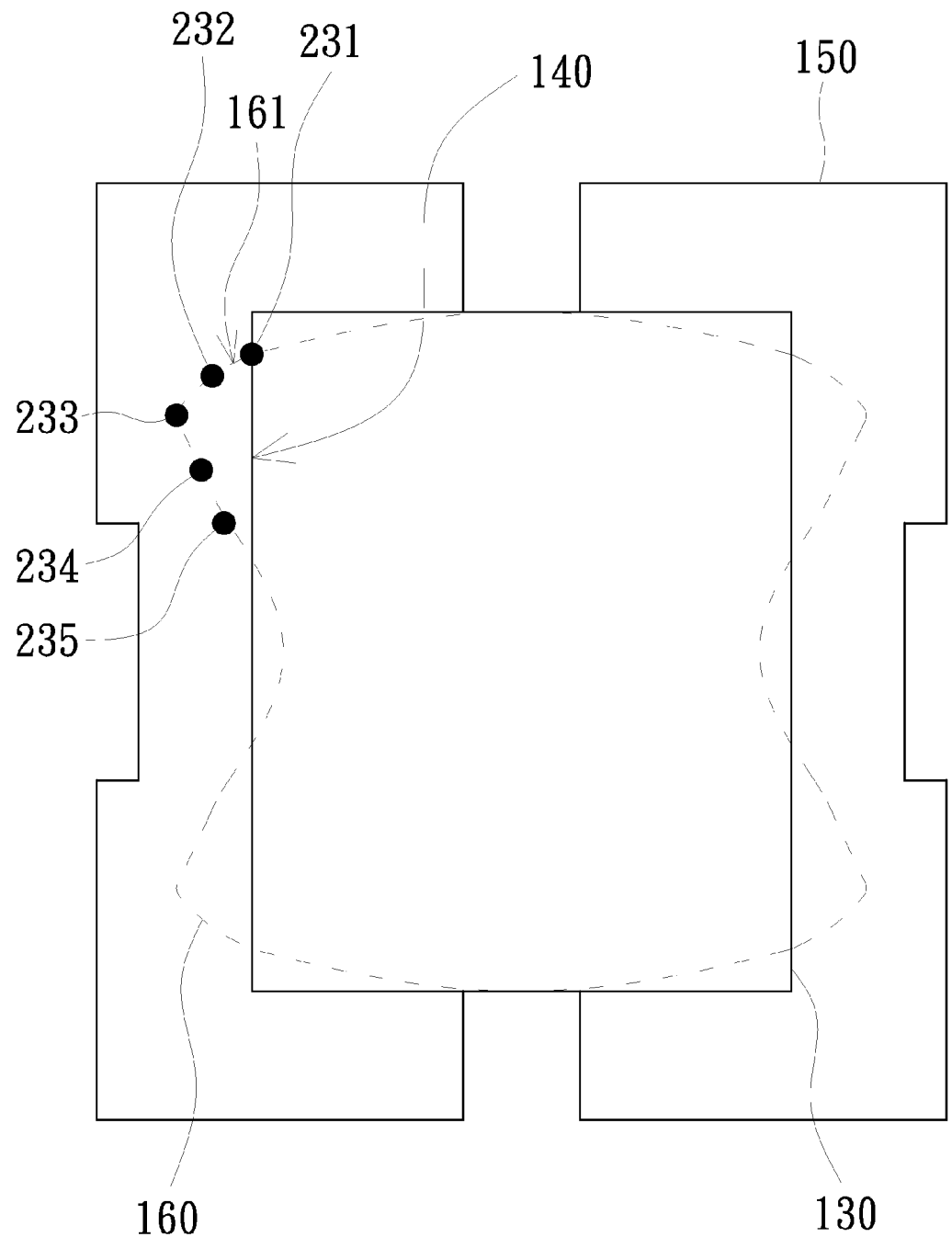
FIG. 5 illustrates an example curve of first contour having multiple points for defining an equation of the curve.

After the first OPC procedure has been performed on the IC design layout, a first photolithography simulation procedure is performed in Step 110. Specifically, in Step 110, it is determined what shape a hypothetical photomask having a feature with the first modified margin 150 would have be formed on a wafer if the photomask was exposed by a photolithography tool. The simulated shape generated by the first photolithography simulation procedure is called a first contour 160, as shown in FIG. 4. In the embodiment, the first contour 160 may have multiple curves respectively corresponding to one of those segments of the original margin 130. For instance, the curve 161 is arranged with respect to the segment 140 (shown in FIG. 5).

Next, in Step 202, an equation of each of the curves of the first contour 160 is obtained. Take the curve 161 for example. With regard to FIG. 5, there are multiple points such as points 231, 232, 233, 234, and 235 on the curve 161. An equation of the curve 161 may be defined by using the points 231~235. Each equation of the curves of the first contour 160 may be expressed as a Taylor series. For example, the equation of the curve 161 is expressed as follow:

$$f(y)=a_n y^n + a_{n-1} y^{n-1} + a_{n-2} y^{n-2} + \ldots + a_1 x + a_0,$$

where $a_0$ is a constant, $a_1, \ldots, a_n$ are numbers or coefficients and y is a variable.

The method 100 next proceeds to Step 204, which includes manipulating each equation of the curves of the first contour 160 to obtain a vertex of each of the curves. More specifically, each equation of the curves is differentiated (or undergone differentiation) to obtain a first derivative; and then a value of a variable at each vertex of the curves may be obtained by setting each first derivative equal to zero. In other words, each vertex of the curves of the contour 160 may be found. For instance, the first derivative of the equation of the curve 161 is set to be equal to zero, as follow:

$$f'(y) = n a_n y^{n-1} + (n-1) a_{n-1} y^{n-2} + \ldots + a_1 = 0.$$

Then, the value of y at the vertex which is found to be the point 233 of the curve 161 may be acquired.

Figure 6:
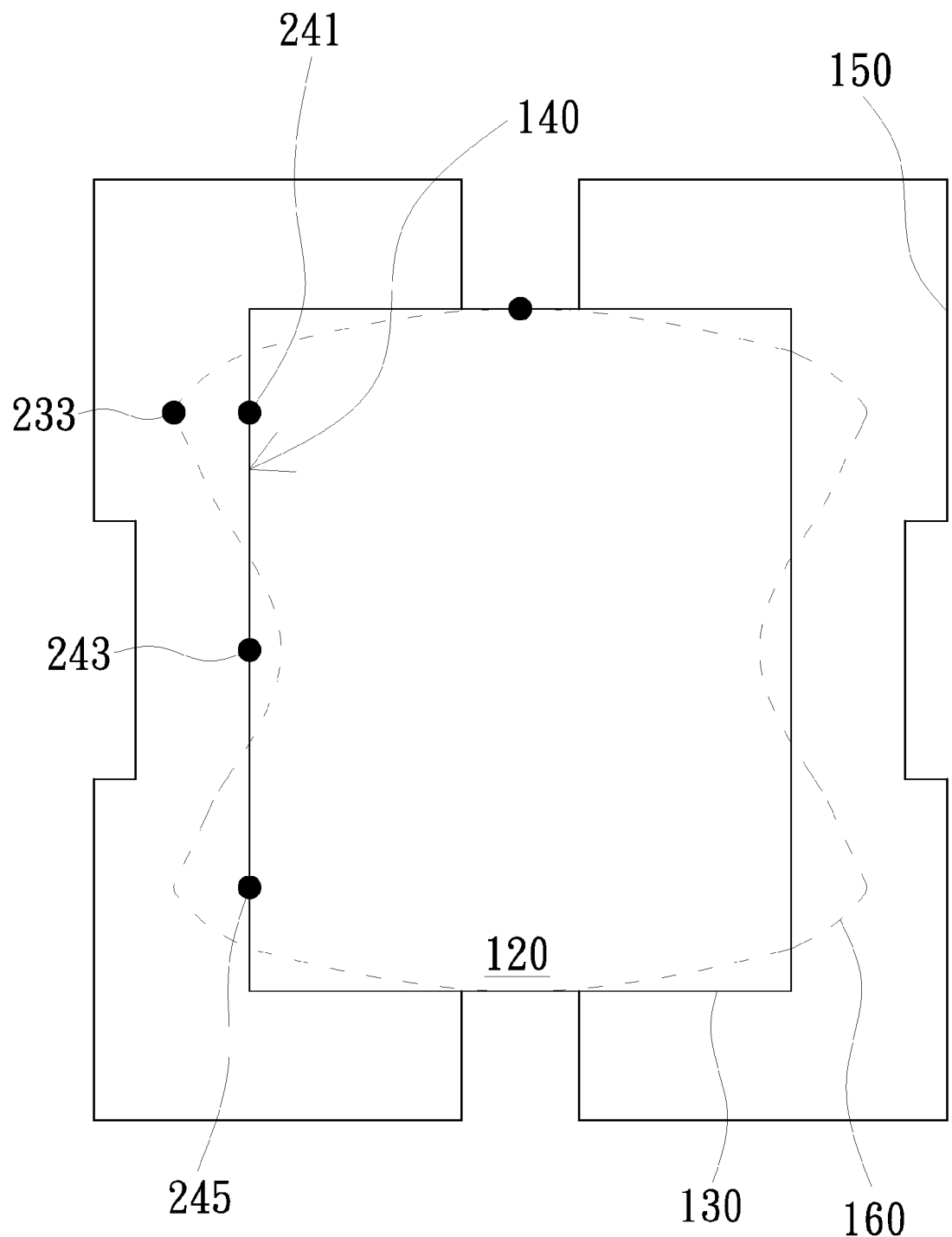
FIG. 6 illustrates target points assigned to the main feature after manipulating an equation of the curve.

Then, in Step 206, another group of target points are assigned to the original margin 130 of the main feature 120 by the vertices of the curves of the first contour 160. Besides, each target point of the another group of target points is respectively configured on the original margin 130 corresponding to one of the vertices of the curves of the first contour 160. In other words, a value of the variable at one target point of the first group of target points is equal to the value of the variable at the respective vertex. As illustrated in FIG. 6, three of the segments of the original margin 130 are respectively assigned with a plurality of target points 241, 243, and 245. The target point 241, assigned to the segment 140 of the original margin 130, for example, corresponds to the vertex 233 of the curve 161. More specifically, the target point 241 on the segment 140 of the original margin 130 having a value of y as being equal to the value of y at the vertex 233 is found. Likewise, values of y at the target points 243 and 245 are respectively equal to a value of y at one of vertices.

Figure 7:
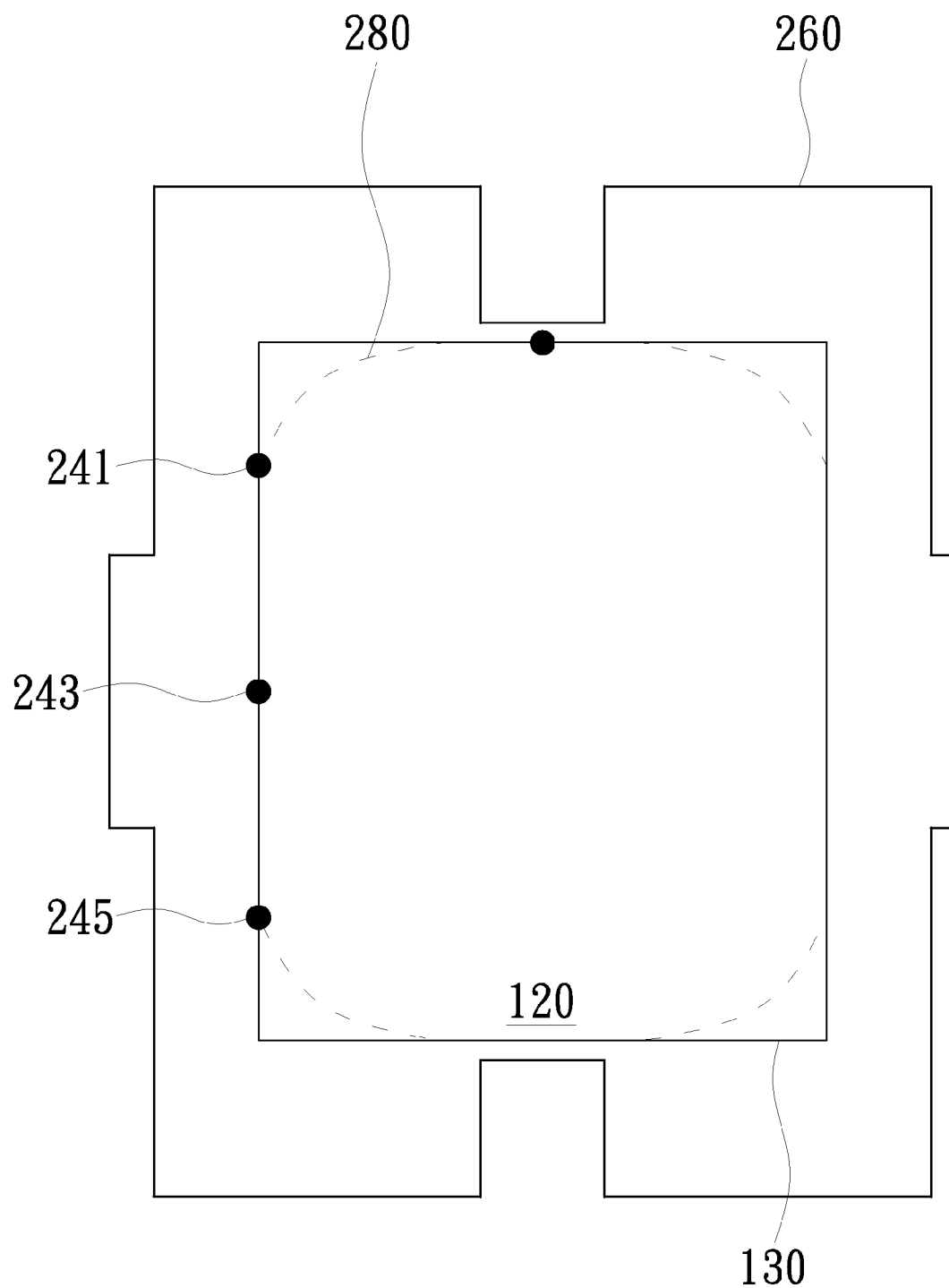
FIG. 7 illustrates an example main feature with a second modified margin as well as a second contour.

Next, in Step 208, a second OPC procedure is performed on the IC design layout according to another group of target points, e.g. the target points 241, 243, and 245. In the embodiment, the second OPC procedure includes repeating a convergence process so that the shape of the original margin 130 may be altered by shifting the relative positions of the segments that make up a second modified margin. In this regards, FIG. 7 is an example of an IC design layout after it has undergone the second OPC procedure. FIG. 7 illustrates the original margin 130 and the second modified margin 260. As mentioned above, the second modified margin 260 of the main feature 120 is formed by independently shifting the positions of the segments of the main feature 120. By comparing FIG. 7 with FIG. 6, a segment of the second modified margin 260 corresponding to the segment 140 is closer to the target point 241 than a segment of the first modified margin 150.

Then, the method 100 proceeds to Step 210 where a second photolithography simulation procedure is performed to generate a second contour 280, as shown in FIG. 7. Specifically, a photolithography exposure of the main feature 120 with the second modified margin 260, which is structurally different from the first modified margin 150, is simulated. Next, in Step 300, an OPC evaluation procedure is performed to determine if the contour is within a threshold. Specifically, the second contour 280 may be compared to the original margin 130 at another group of target points. In the embodiment, the second contour 280 meets or overlaps another group of target points, such as, the target points 241, 243, and 245 located along the original margin 130 so that it passes the OPC evaluation procedure. Finally, the IC design layout having the main feature 120 with the second modified margin 260 may be outputted in Step 400 for photomask fabrication.

Therefore, the method 100, particularly includes Steps 202, 204, 206, and 208, allows for a higher fidelity IC main feature to be formed in the IC. For example, in comparison between the first contour 160 and the second contour 280, the second contour 280 is closer to the target points (e.g. 241, 243, 245) than the first contour 160. In other words, the second contour 280 more closely approximates the original margin 130 than the first contour 160.

It is to be noted that, referring to FIG. 1, the memory module 40, being the non-transitory computer-readable storage, includes various instructions executable by said processor 20, these various instructions stored in the memory module 40 are configured to perform each of the steps, namely Steps 102, 104, 106, 108, 110, 202, 204, 206, 208, 210, 300, and 400 as shown in FIG. 2.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for integrated circuit (IC) design, comprising steps of:
   receiving an IC design layout having a main feature with an original margin;
   generating a first modified margin of said main feature;
   performing a first photolithography simulation procedure of said main feature with said first modified margin by using a processor to generate a first contour having a plurality of curves;
   obtaining an equation of each of said curves, each of said equations is expressed as a Taylor series;
   manipulating each of said equations of said curves by using said processor to obtain a vertex of each of said curves of said first contour;
   assigning a first group of target points to said original margin of said main feature, wherein said first group of target points comprising a plurality of target points, each target point of said first group of target points respectively corresponds to one of said vertices;
   performing an optical proximity correction (OPC) procedure by using said first group of target points to generate a second modified margin;
wherein said step of generating said first modified margin of said main feature comprises:
   dissecting said original margin of said main feature into a plurality of segments, wherein said curves respectively correspond to one of said segments;
   assigning a second group of target points to said original margin of said main feature, the second group of target points comprising a plurality of target points; and
   performing an another OPC procedure by using said second group of target points to generate said first modified margin;
wherein image errors are compensated for fabricated IC structures by modifying IC design layout structures for enabling photomask fabrication so that a higher fidelity IC main feature is obtained, wherein a second contour is closer to the first group of target points than the first contour, and the second modified margin is structurally different from the first modified margin.

2. An apparatus for integrated circuit (IC) design, comprising:
   a processor;
   a receiving module, communicatively coupled to said processor and configured to receive an IC design layout having a main feature with an original margin; and
   a non-transitory computer-readable storage, communicatively coupled to said processor and comprising instructions executable by said processor, said instructions comprising:
      instructions to generate a first modified margin of said main feature;
      instructions to perform a first photolithography simulation procedure of said main feature with said first modified margin to generate a first contour having a plurality of curves;
      instructions to obtain an equation of each of said curves, wherein each said equation is expressed as a Taylor series;
      instructions to manipulate each said equation of said curves to obtain a vertex of each of said curves;
      instructions to assign a first group of target points to said original margin of said main feature, wherein each of said first group of target points respectively corresponds to one of said vertices; and instructions to perform an optical proximity correction (OPC) procedure by using said group of target points to generate a second modified margin;

wherein said instructions of generating said first modified margin of said main feature comprises:

instructions to dissect said original margin of said main feature into a plurality of segments;

instructions to assign a second group of target points to said original margin of said main feature; and instructions to perform an another OPC procedure by using said second group of target points to generate said first modified margin;

wherein image errors are compensated for fabricated IC structures by modifying IC design layout structures for enabling photomask fabrication so that a higher fidelity IC main feature is obtained, wherein a second contour is closer to the first group of target points than the first contour, and the second modified margin is structurally different from the first modified margin.

3. The method according to claim 1, wherein each equation expressed as said Taylor series is defined by a plurality of points of each of said curves.

4. The method according to claim 3, wherein said points of each of said curves comprise said vertex thereof.

5. The method according to claim 1, wherein said step of manipulating each said equation comprises:

obtaining a first derivative by performing differentiation on each said equation; and setting each said first derivative equal to zero to obtain a value of a variable at each said vertex.

6. The method according to claim 5, wherein a value of said variable at one target point of said first group of target points is equal to said value of said variable at said vertex corresponding to said target point.

7. The method according to claim 1, further comprising steps of:

performing a second photolithography simulation procedure of said second modified margin by using said processor to generate said second contour; and performing an OPC evaluation procedure to determine if said second contour meets said first group of target points.

8. The method according to claim 7, further comprising a step of outputting said IC design layout having said main feature with said second modified margin if said second contour meets said first group of target points.

9. The method according to claim 1, wherein said step of performing said OPC procedure comprises performing a convergence process repeatedly.

10. The apparatus according to claim 2, wherein said instructions to manipulate each said equation comprise:

instructions to obtain a first derivative by performing differentiation on each said equation; and instructions to let each said first derivative equal to zero to obtain a value of a variable at each said vertex.

11. The apparatus according to claim 2, wherein said instructions further comprise:

instructions to perform a second photolithography simulation procedure of said second modified margin to generate said second contour; and instructions to perform an OPC evaluation procedure to determine if said second contour meets said first group of target points.

12. The apparatus according to claim 11, wherein said instructions further comprise instructions to output said IC design layout having said main feature with said second modified margin if said second contour meets said first group of target points.

13. The apparatus according to claim 2, wherein said instructions to perform said OPC procedure comprise instructions to perform a convergence process repeatedly.

* * * * *